United States Patent [19]

Rosenthal et al.

[11] 4,051,392

[45] Sept. 27, 1977

[54] CIRCUIT FOR STARTING CURRENT FLOW IN CURRENT AMPLIFIER CIRCUITS

[75] Inventors: Bruce David Rosenthal, Highland Park; Andrew Gordon Francis Dingwall, Somerville, both of N.J.

[73] Assignee: RCA Corporation, New York, N.Y.

[21] Appl. No.: 675,206

[22] Filed: Apr. 8, 1976

[51] Int. Cl.[2] .......... H03K 17/00

[52] U.S. Cl. .......... 307/297; 307/251; 307/237; 330/296

[58] Field of Search .......... 330/19, 22, 40; 323/154; 307/296, 297, 251

[56] References Cited

U.S. PATENT DOCUMENTS

| | | | |
|---|---|---|---|
| 3,813,607 | 5/1974 | Voorman | 323/4 |
| 3,911,353 | 10/1975 | VandePlassche | 323/4 |

*Primary Examiner*—Stanley D. Miller, Jr.
*Assistant Examiner*—B. P. Davis
*Attorney, Agent, or Firm*—H. Christoffersen; S. Cohen; A. L. Limberg

[57] ABSTRACT

A circuit comprising first and second current amplifiers connected in a regenerative feedback loop and which includes a starting circuit. The latter initiates current flow in the loop and is automatically disconnected from the loop once normal operating conditions are reached therein.

10 Claims, 1 Drawing Figure

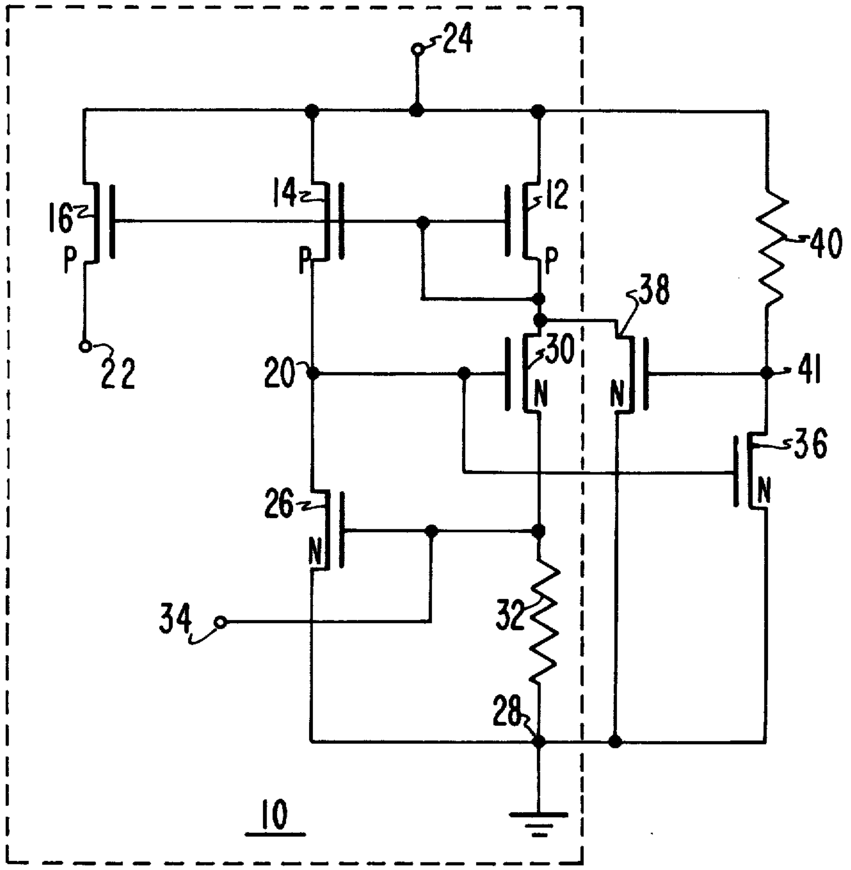
24
16
P
14
P
12
P
22
38
40
20
30
N
N
41
36
N
26
N
34
32
28
10

CIRCUIT FOR STARTING CURRENT FLOW IN CURRENT AMPLIFIER CIRCUITS

This invention relates to improved amplifier circuits and in particular to such circuits which produce regulated values of current and voltage.

The sole FIGURE is a schematic circuit diagram of a preferred embodiment of the invention.

Referring to the FIGURE, the portion of the circuit shown within the dashed lines is a current source 10 known in the art. The transistors used herein are a class of conductor-insulator-semiconductor (CIS) devices known as metal-oxide-semiconductor (MOS) transistors. P-type MOS transistors 12, 14 and 16 comprise a current mirror amplifier (CMA) having an input node 18, first and second output nodes 20 and 22, and a common terminal 24 to which an operating voltage may be applied. The conduction paths of transistors 12, 14 and 16 are connected between terminal 24 and nodes 18, 20 and 22, respectively. The gate electrodes of these transistors are interconnected at a common point and this point is connected to node 18. The conduction path of NMOS transistor 26 is connected between node 20 and a node 28 at a reference potential, herein ground. The conduction paths of NMOS transistor 30 is connected between node 18 and the common connection of resistor 32 and the gate electrode of transistor 26. Output terminal 34 is also connected to this common connection. The other end of resistor 32 is connected to node 28.

The gate electrode of transistor 30 is connected to node 20 and to gate electrode of NMOS transistor 36. The conduction path of this latter device is connected at one end to node 28 and at its other end to both the gate electrode of NMOS transistor 38 and to one end of resistor 40. The other end of this resistor is connected to terminal 24. The conduction path of transistor 38 is connected between nodes 18 and 28. The entire circuit shown in the FIGURE may, in practice, be integrated onto a common semiconductor substrate.

The circuit 10 of the FIGURE is a source of highly stable constant amplitude current and voltage. In the operation of this circuit, assume initially that a voltage exists across resistor 32 of sufficient value to cause transistor 26 to conduct. Such a voltage is established by the flow of current through diode-connected transistor 12 and transistor 30. The conduction of transistor 26 causes the voltage at node 20 to drop towards the reference potential, tending to turn off transistor 30, which in turn tends to reduce the voltage across resistor 32. As a result, the voltage across resistor 32 is regulated and maintains a value slightly in excess of the value of the threshold voltage of transistor 26. This regulated voltage may be supplied to an arbitrary load (not shown) connected to terminal 34.

The regulation of the voltage across resistor 32 means that the current through it is held constant. This current flows through transistor 12 (the effect of transistor 38 will be explained below) and serves as a stable source of input current for the CMA comprising transistors 12, 14 and 16. This current is mirrored via transistors 14 and 16 thereby providing a current through each that is proportional to the relative transconductances of these devices with respect to the transconductance of transistor 12. Thus, a highly stable value of constant current may be obtained at output terminal 22. The principal function of transistor 14 is to serve as a high impedance load for transistor 26 thereby enabling the latter device to operate as a high gain amplifier.

The circuit 10 is not self-starting. Transistors 12, 14, 26 and 30 may be viewed as a regenerative or positive feedback connection of two current amplifiers. The first amplifier comprises transistors 12 and 14 with nodes 18 and 20 serving as its input and output points, respectively. The second amplifier comprises transistors 26 and 30 where nodes 20 and 18 are its input and output points, respectively. When an operating voltage is applied to circuit 10, no current flows in either current amplifier and transistors 12, 14, 26 and 30 are off. Some means external to circuit 10 is needed to initiate circuit operation.

An additional shortcoming of the circuit 10 is the tendency of the current amplifiers to turn off and remain off if the voltage at node 20 momentarily assumes a valve low enough to turn off transistor 30. Such a condition could occur if node 20 were momentarily shorted to the reference potential.

The above problems are eliminated by the addition of the start-up circuit comprising transistors 36 and 38 and resistor 40 to the circuit 10. When the first and second current amplifiers are off, for the reasons discussed above, transistor 36 is turned off because of the lack of a proper bias voltage at its gate electrode. When this transistor is off, the voltage at node 41 is at the same potential as the supply voltage at terminal 24. This potential is applied to the gate electrode of transistor 38, thereby turning this device on.

With transistor 38 on, current flow is initiated through transistor 12. This, in turn, turns on transistors 14 and 16. The turning on of transistor 14 causes the voltage at node 20 to rise towards the value of the voltage present at terminal 24. This turns on transistor 30, thus supplying additional current flow through transistor 12. The current flowing through transistor 30 causes the voltage across resistor 32 to increase, thereby turning on transistor 26 when this voltage exceeds the threshold voltage of this latter transistor. Circuit 10 is now fully energized.

The rising voltage at node 20, due to the turning on of transistors 12 and 14, turns on transistor 36 which causes the voltage at node 41 to drop to a level relatively close in value to the reference potential. This drop in voltage turns off transistor 38 thereby effectively removing this device from circuit 10. Thus, once circuit 10 becomes fully energized, the startup circuit has no further effect on the operation of the circuit 10. The only penalty paid is some additional power dissipation - the flow of current through device 36 and this can be kept low by making resistance 40 of reasonable value such as 200 KΩ to 1 megΩ. To cause stable operation of this circuit after start-up, the following inequality should be satisfied:

$$g_m(26) >> \frac{g_m(14)}{g_m(12) \cdot R32}$$

where $g_m$ ( ) represents the transconductance of the device indicated within the parentheses and R32 is the resistance value of resistor 32.

An alternative configuration to that shown in the FIGURE is to connect the conduction paths of transistors 38 and 30 in parallel. All other connections are unchanged. A possible shortcoming of such a circuit is that the relative impedances of the conduction path of transistor 38 and resistor 32 must be considered to ensure that the turning on of transistor 38 does not raise the voltage across resistor 32 to such a high value that transistor 26 conducts too heavily. If such heavy conduction occurs, node 20 may be pulled down to a value near the reference potential, keeping transistor 30 from turning on, thereby interfering with normal circuit operation. No such restriction is placed on the circuit of the FIGURE.

It should be appreciated that the MOS transistors in the FIGURE may be replaced by other CIS devices or by devices having the opposite conductivity type if the circuit voltages are suitably modified.

What is claimed is:

1. In a circuit comprising first and second current amplifiers, each amplifier having input and output terminals, said first current amplifier input and output terminals connected to said second current amplifier output and input terminals respectively, forming a positive feedback loop thereby, wherein said circuit has the undesirable tendency to fail to initiate conduction within said loop upon application of an operating voltage thereto, the improvement comprising a starting circuit for overcoming said undesirable tendency, said improvement comprising:

first means responsive to said application of an operating voltage for initiating a current flow through said first amplifier input terminal, said first means including a first transistor with a control electrode and with a conduction path connected at one end to said first current amplifier input terminal and at its other end to a point at a reference potential; and second means responsive to the initiation of current flow within said loop for effectively disconnecting said first means from said loop, said second means including an impedance and a second transistor with a control electrode and with a conduction path, said impedance and said second transistor conduction path being serially connected between a terminal for an operating voltage and said point at a reference potential, the point of interconnection between said impedance and said second transistor conduction path being connected to said first transistor control electrode, and said second transistor control electrode being connected to said first amplifier output terminal.

2. The combination as set forth in claim 1 wherein said first and second transistors each comprise conductor-insulator-semiconductor type devices.

3. In a circuit which includes a first terminal to which an operating voltage may be applied and a second terminal connected to a reference potential;

first and second transistors each with a controlled conduction path and a control electrode; and first and second current paths between said first and second terminals, said first path including the serially connected conduction paths of said first and second transistors, and said second path including means responsive to current through said first transistor for establishing a current in said second path that is proportionally related to the current through said first path, the improvement comprising:

means responsive to the operating voltage at said first terminal for initiating current flow through said first path, whereby current flows through said second path, said means for initiating current flow including a third transistor with a controlled conduction path and a control electrode, said third transistor conduction path connected between said second terminal and the interconnection of the serially connected conduction paths of said first and second transistors, and means responsive to the voltage at said first terminal for applying a turn on voltage to said control electrode of said third transistor; and means responsive to current at a given level in said second path for effectively removing said means for initiating current flow, said means for effectively removing said means for initiating current flow comprising means for removing said turn-on voltage from said control electrode of said third transistor.

4. The combination as set forth in claim 3 wherein said first transistor is diode connected.

5. The combination as set forth in claim 3 wherein said means for applying a turn on voltage comprises impedance means connected between said first terminal and said control electrode of said third transistor, and wherein said means for removing comprises a fourth transistor having a conduction path connected between said control electrode of said third transistor and said second terminal, and a control electrode connected to a point along said second current path at which a voltage is produced when current flows through said second current path, said fourth transistor being of a conductivity type such that it turns on in response to said voltage, when the latter reaches a given level.

6. In a circuit as set forth in claim 4, said second path including a further transistor having a conduction path through which the current in said second path flows and a control electrode, said diode connected transistor being connected between the control electrode and one end of the conduction path of said further transistor and forming a current mirror therewith, and said second path including also a series element across which a voltage develops when current flows through said second path.

7. In a circuit as set forth in claim 6, said means responsive to current at a given level comprising means for sensing the voltage across said series element.

8. A current mirror amplifier having an input current path between an input terminal and a common terminal and an output current path between an output terminal and said common terminal;

means for initiating current flow through said input current path whereby a current is established through said output current path, said means for iniitiating current flow including a first transistor with a control electrode and a controllable conduction path connected at one end to said current mirror amplifier input terminal and at its other end to a point at a reference potential; and means responsive to said current through said output current path for biasing the control electrode of said first transistor to reduce conduction in its controllable conduction path, thereby disabling said means for initiating current flow without interrupting said current through said output path.

9. The combination as set forth in claim 8 wherein said means for initiating current flow comprises a first transistor having a conduction path and a control electrode, said conduction path connected at one end to said current mirror amplifier input terminal and at its other end to a point at a reference potential and said control electrode connected to said means for disabling.

10. The combination as set forth in claim 8 wherein said means for biasing the control electrode of said first transistor comprises an impedance and a second transistor having a control electrode and a conduction path, said impedance and said second transistor conduction path serially connected between a terminal for an operating voltage and a point at a reference potential, the point of interconnection between said impedance and said second transistor conduction path being connected to said first transistor control electrode and said second transistor control electrode being connected to said current mirror amplifier output terminal.

* * * * *